United States Patent
Bromley et al.

(10) Patent No.: US 7,271,099 B2
(45) Date of Patent: Sep. 18, 2007

(54) FORMING A CONDUCTIVE PATTERN ON A SUBSTRATE

(75) Inventors: Nigel Ingram Bromley, Milton Keynes (GB); Martin Philip Gouch, Herts (GB); Christoph Bittner, Herts (GB)

(73) Assignee: FFEI Limited, Hertfordshire (GB)

( * ) Notice: Subject to any disclaimer, the term of this patent is extended or adjusted under 35 U.S.C. 154(b) by 85 days.

(21) Appl. No.: 11/146,498

(22) Filed: Jun. 6, 2005

(65) Prior Publication Data

US 2006/0273069 A1 Dec. 7, 2006

(51) Int. Cl.
*H01L 21/76* (2006.01)

(52) U.S. Cl. ............ 438/689; 438/628; 438/644; 438/669; 257/763; 257/99; 257/79; 257/82; 257/83; 428/209; 428/210

(58) Field of Classification Search ......... 438/689; 257/763; 428/209
See application file for complete search history.

(56) References Cited

U.S. PATENT DOCUMENTS

2002/0072228 A1* 6/2002 Kuo ............ 438/669
2003/0146019 A1* 8/2003 Hirai ............ 174/257

* cited by examiner

*Primary Examiner*—Nadine Norton
*Assistant Examiner*—Maki Angadi
(74) *Attorney, Agent, or Firm*—Sughrue Mion, PLLC

(57) ABSTRACT

A method of forming a conductive pattern on a substrate. The method comprising providing a substrate carrying a conductive layer; forming a first portion of the conductive pattern by exposing the conductive layer to a laser and controlling the laser to remove conductive material around the edge(s) of desired conductive region(s) of the first portion; and laying down an etch resistant material on the conductive layer, the etch resistant material defining a second portion of the conductive pattern, removing conductive material from those areas of the second portion not covered by the etch resistant material, and then removing the etch resistant material.

8 Claims, 5 Drawing Sheets

FORMING A CONDUCTIVE PATTERN ON A SUBSTRATE

BACKGROUND OF THE INVENTION

The invention relates to a method of forming a conductive pattern on a substrate, for example so as to form an electronic circuit.

In one approach to forming very high resolution electrical circuits, for example that used by LPKF Laser and Electronics AG of Germany, a laser is used to cut a narrow line through a layer of a conductive material on an insulating substrate. Complete loops of such cuts are used to isolate areas of conductor which then become the conductive traces of the circuit. This process is useful for forming prototype circuit boards but is slow and the resulting circuit has large areas of unwanted conductor remaining. These are normally left in place since it would take a very long time to use the laser to remove them.

An alternative approach which can be used for low resolution circuits is to define the required circuit as a rasterised image which is then printed, typically using an ink jet printer, over the whole area of the conductive layer using an ink capable of resisting a chemical etch. The required circuit pattern is then produced by etching the conductive layer where it is not covered with the ink, and then removing the ink using another chemical such as a solvent. This process is suitable for producing small volume or prototype products as it is reasonably fast and economical with materials but is not capable of high resolution. This is because of the rasterisation process and the unpredictable behaviour of the printing heads and of the ink on the surface.

SUMMARY OF THE INVENTION

In accordance with the present invention, a method of forming a conductive pattern on a substrate comprises:
 a) providing a substrate carrying a conductive layer;
 b) forming a first portion of the conductive pattern by exposing the conductive layer to a laser and controlling the laser to remove conductive material around the edge(s) of desired conductive region(s) of the first portion; and,
 c) laying down an etch resistant material on the conductive layer, the etch resistant material defining a second portion of the conductive pattern, removing conductive material from those areas of the second portion not covered by the etch resistant material, and then removing the etch resistant material.

We have realized that typical circuits have some areas requiring high resolution, for example tracks around high density Ball Grid Array (BGA) chips, and other, normally larger areas, where a lower resolution is adequate. It is then possible to optimize the use of the two techniques so that the laser process is only used in those areas requiring high resolution and the etch process is used in the remaining, low resolution areas.

In some cases, the etch resistant material could be confined to the second portion but this has the disadvantage that it is necessary to prevent the removal chemical from reaching the first portion. Preferably, therefore, the etch resistant material at least overlaps the conductive regions of the first portion and preferably is laid down as a solid block over the whole of the first portion.

Typically, the etch resistant material will be printed, for example using an ink jet printer or other conventional printer.

BRIEF DESCRIPTION OF THE DRAWINGS

An example of a method according to the invention will now be described with reference to the accompanying drawings, in which:—

DETAILED DESCRIPTION OF EMBODIMENTS

Figure 1A:
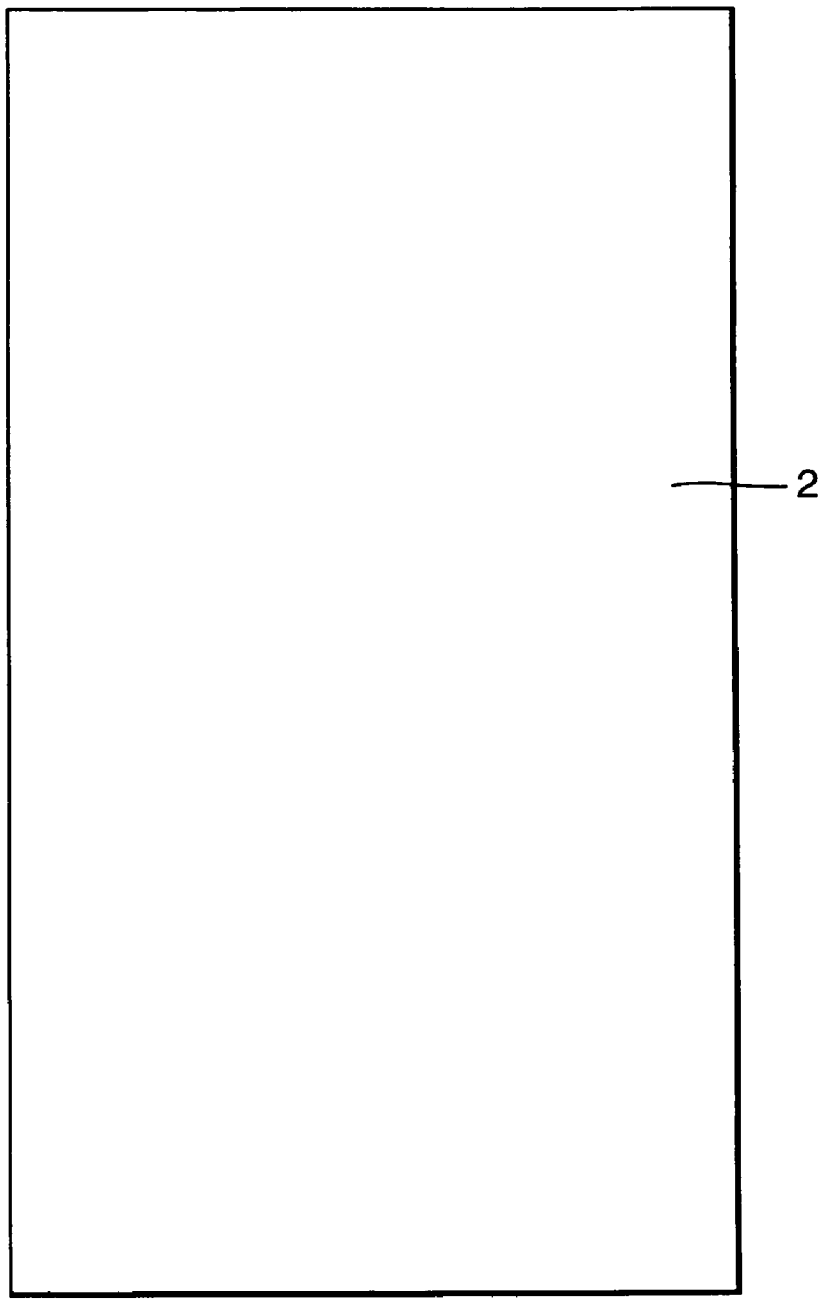
FIGS. 1A and 1B are a plan and schematic cross-section of a substrate carrying a conductive layer; and, FIGS. 2 to 5 illustrate plan views of the conductive layer at successive stages during the process.
Figure 1B:
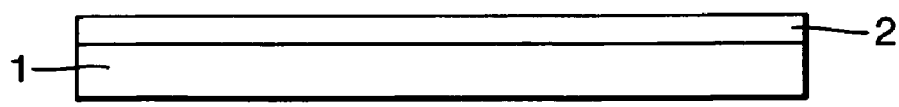
Figure 2:
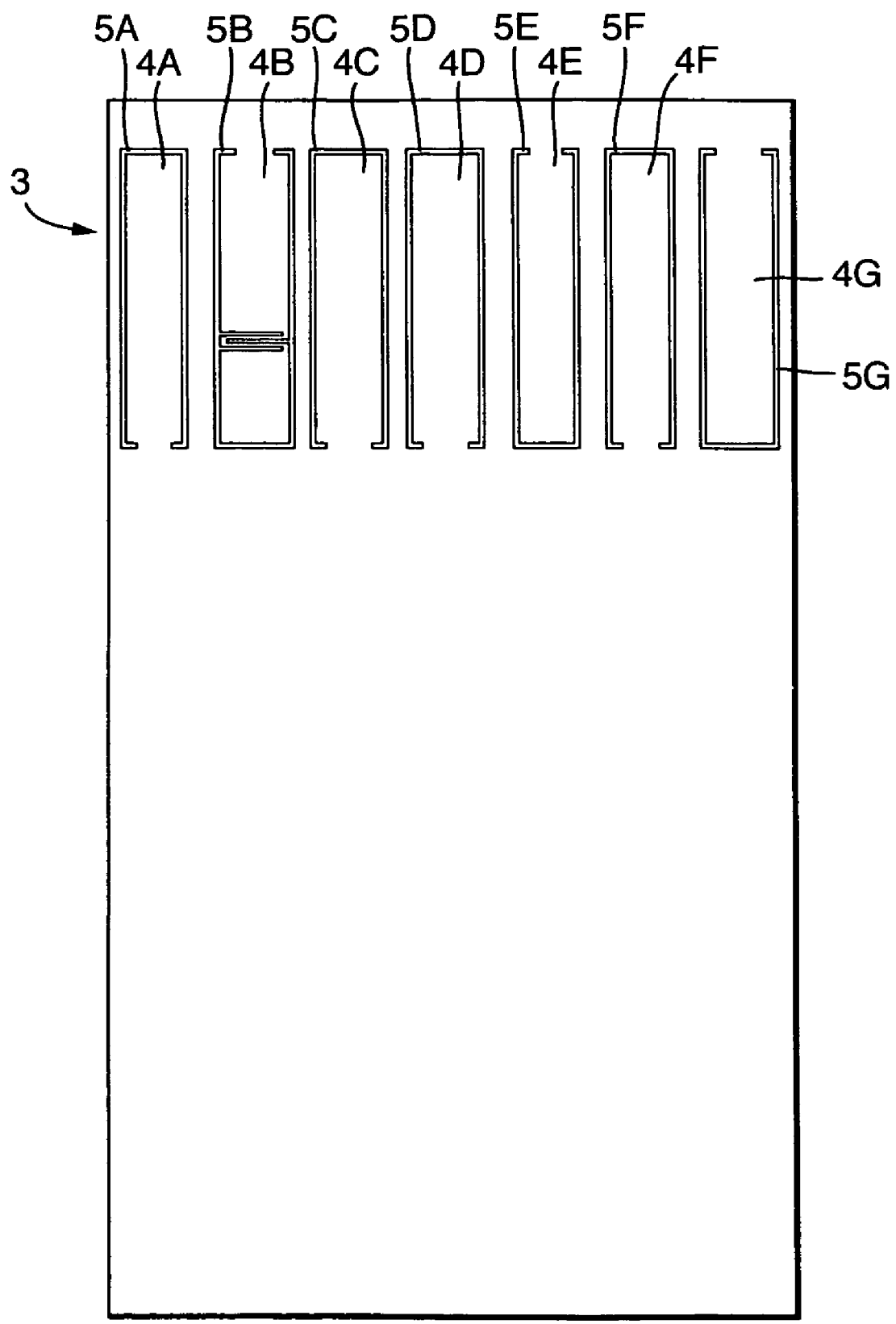

FIGS. 1A and 1B illustrate an insulating substrate 1 on which is provided a continuous, conductive, e.g. copper, surface layer 2.

In the first stage of the process, a first portion 3 of the copper layer 2 is exposed to a laser beam (not shown). A suitable beam could be generated from a neodymium YAG or frequency-doubled YAG laser. The laser beam is controlled to define the edges of desired conductive regions 4A-4G by removing or ablating thin lines of the conducting material as shown at 5A-5G. Portions of the substrate 1 can be seen through the regions 5A-5G. A resolution better than 100 μm is achieved, even to 25 μm.

Figure 3:
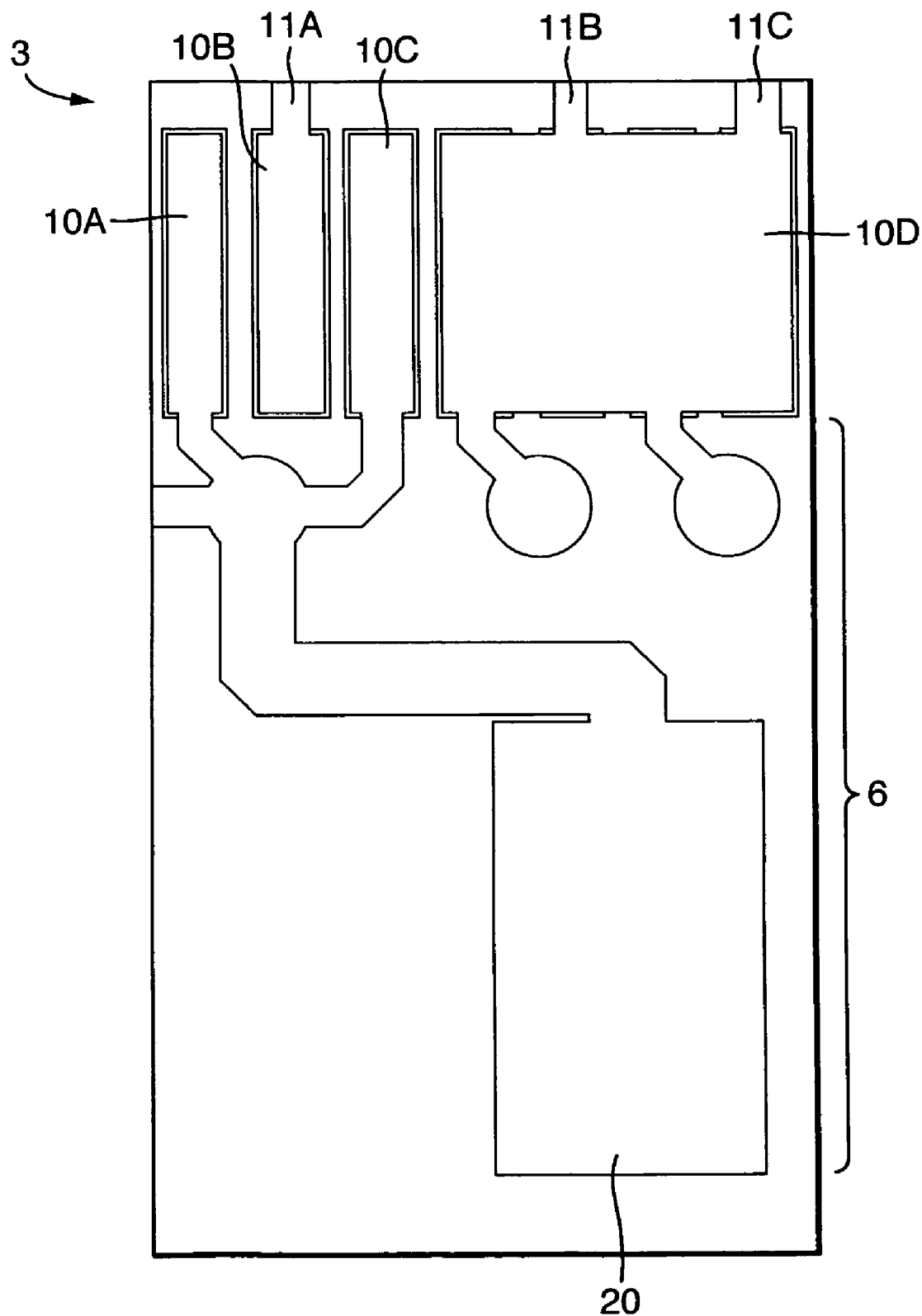

In the next step (FIG. 3), an etch resist ink 20, such as Jetrack Etch Resist 001 from Avecia Electronic Materials, is applied using an ink jet printer (not shown) onto the surface of the copper layer 2. In the portion 6, this etch resist ink defines the desired circuit pattern at a relatively low resolution, e.g. 100 μm or more. In the portion 3, the etch resist ink is laid down in regions 10A-10C on previously defined conductive regions 4A-4C so as slightly to overlap the corresponding etch lines 5A-5C. In addition, a solid block of the etch resist ink 10D is laid down over all the regions 4D-4G. Finally, the etch resist ink is also laid down so as to define connection tabs 11A-11C.

Figure 4:
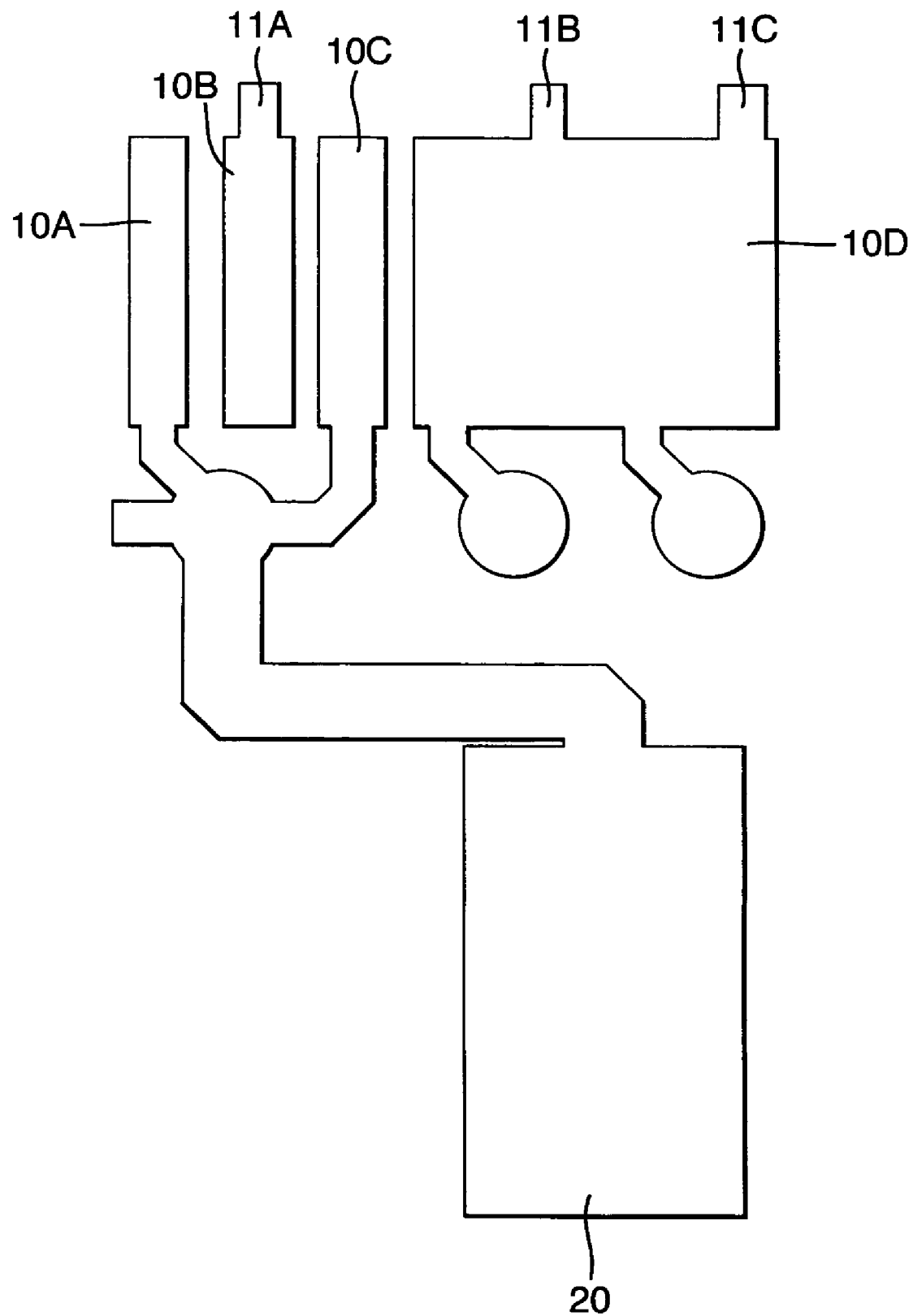

In the next stage, a chemical etchant, such as ferric chloride, is applied to the entire surface of the conductive material 2 and this removes all exposed regions of copper to leave the etch resist ink alone as can be seen in FIG. 4. (The edge of the substrate 1 is omitted in FIG. 4.)

Figure 5:
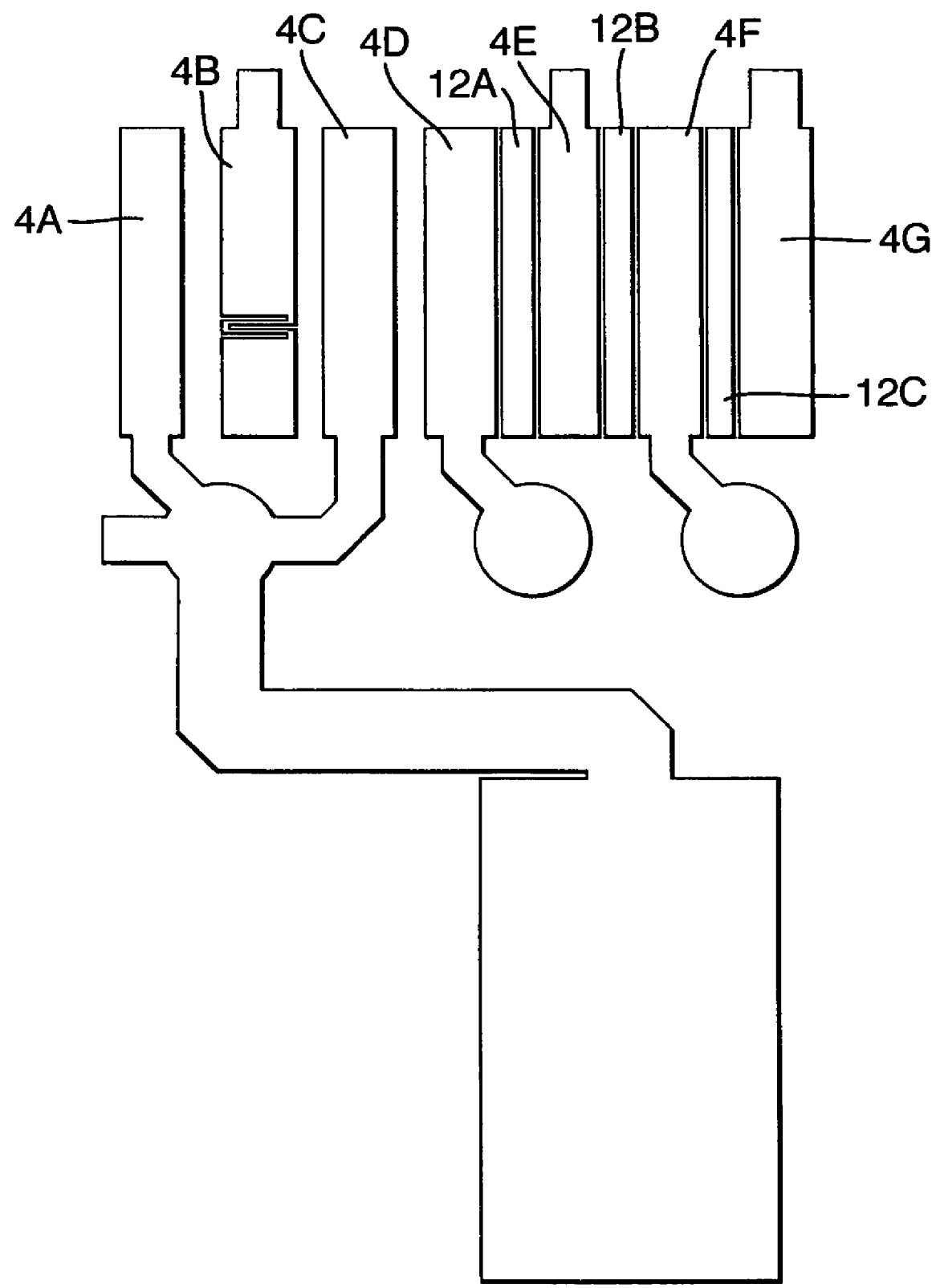

Finally, the etch resist ink is removed using a conventional solvent, such as acetone or sodium hydroxide solution, so as to leave the patterned copper only, as can be seen in FIG. 5. It will be seen in FIG. 5 that some regions of copper 12A-12C are left and these are redundant.

Where the laser-defined pattern meets the inkjet-defined pattern there will need to be some small overlap to take up any registration error between the two processes. For example, the laser cuts could extend for some distance into the area to be patterned by inkjet. Alternatively, it is possible to control the placing of etch resist ink using the different wetting properties of the ink on the conducting layer and on the insulating layer revealed when the conducting layer is removed; this opens the possibility of using laser cuts to locate inkjet printed material more accurately in the overlap region.

The laser and ink jet printer could be mounted on a single machine capable of X-Y vector and raster scanning, or two separate machines could be used.

We claim:
1. A method of forming a conductive pattern on a substrate, the method comprising:
 a) providing a substrate carrying a conductive layer;
 b) forming a first portion of the conductive pattern by exposing the conductive layer to a laser and controlling the laser to remove conductive material around the edge(s) of desired conductive region(s) of the first portion; and, c) laying down an etch resistant material on the conductive layer, the etch resistant material defining a second portion of the conductive pattern, removing conductive material from those areas of the second portion not covered by the etch resistant material, and then removing the etch resistant material, wherein the first portion of a conductive pattern is formed at a higher resolution than the second portion of the conductive pattern.

2. A method according to claim 1, wherein the etch resistant material is laid down also over the first portion of the conductive pattern in step c).

3. A method according to claim 2, wherein the etch resistant material overlaps the conductive region(s) of the first portion.

4. A method according to claim 2, wherein the etch resistant material is laid down as a solid block over the first portion.

5. A method according to claim 1, wherein the first portion overlaps the second portion.

6. A method according to claim 1, wherein the first portion of the conductive pattern has features defined to a resolution of 100 μm or less, while the second portion has features defined to a resolution of more than 100 μm.

7. A method according to claim 1, wherein the etch resistant layer is printed in step c).

8. A method according to claim 7, wherein the etch resistant material is ink jet printed.

* * * * *